(12) United States Patent
Sareen et al.

(10) Patent No.: US 8,193,841 B2
(45) Date of Patent: Jun. 5, 2012

(54) ELECTRONIC DEVICE FOR POWER-ON-RESET

(75) Inventors: Puneet Sareen, Freising (DE); Hermann Seibold, Haag (DE)

(73) Assignee: Texas Instruments Incorporated, Dallas, TX (US)

( * ) Notice: Subject to any disclaimer, the term of this patent is extended or adjusted under 35 U.S.C. 154(b) by 99 days.

(21) Appl. No.: 12/887,246

(22) Filed: Sep. 21, 2010

(65) Prior Publication Data

US 2011/0068838 A1    Mar. 24, 2011

(30) Foreign Application Priority Data

Sep. 21, 2009   (DE) .................. 10 2009 042 388

(51) Int. Cl.
*H03L 7/00* (2006.01)
(52) U.S. Cl. ............... 327/143; 327/77; 327/80; 327/81
(58) Field of Classification Search .................. 327/143, 327/77, 78, 80, 81
See application file for complete search history.

(56) References Cited

U.S. PATENT DOCUMENTS

| 4,293,782 | A | * | 10/1981 | Tanaka et al. | 327/81 |
| 5,825,220 | A | | 10/1998 | Kinugasa et al. | |
| 5,929,673 | A | * | 7/1999 | Haigis et al. | 327/143 |
| 6,144,237 | A | * | 11/2000 | Ikezaki | 327/143 |
| 6,809,565 | B2 | * | 10/2004 | Kawakubo | 327/143 |
| 7,199,623 | B2 | * | 4/2007 | Kwon | 327/143 |
| 7,417,476 | B1 | | 8/2008 | Hung | |

OTHER PUBLICATIONS

DE Search Report, dated Apr. 27, 2010.

* cited by examiner

*Primary Examiner* — Long Nguyen
(74) *Attorney, Agent, or Firm* — John J. Patti; Wade J. Brady, III; Frederick J. Telecky, Jr.

(57) ABSTRACT

An electronic device is provided that includes a power-on-reset (POR) circuit. The POR circuit includes a trigger stage configured to change an output if a first power supply voltage level exceeds a threshold voltage level and a first inverter and a second inverter being cross-coupled. An output of the second inverter is the POR output of the power-up reset circuit. The output is coupled to the trigger stage for switching the trigger stage off in response to a change of a signal at the output of the second inverter. The first inverter is dimensioned to follow with a voltage level at an output an initially rising slope of the first power supply voltage level and the second inverter is dimensioned to keep a voltage level at an output at a second power supply voltage level during the initially rising slope of the first power supply voltage level.

8 Claims, 2 Drawing Sheets

ELECTRONIC DEVICE FOR POWER-ON-RESET

CROSS-REFERENCE TO RELATED APPLICATIONS

This application claims priority from German Patent Application No. 10 2009 042 388.5, filed Sep. 21, 2009, which is hereby incorporated by reference for all purposes.

FIELD OF THE INVENTION

The invention generally relates to an electronic device for power-on-reset (POR).

BACKGROUND

If an electronic circuit is supplied with power (i.e., if the power supply is switched on), some components may not attain predictable states. In order to prevent unpredictable states, it is established in the art to use power-on-reset (POR) circuits. These POR circuits are configured to provide and apply well defined reset signals to the electronic components, as for example to digital circuitry, until the power supply voltage has reached a safe operating value. However, although these stages have become more and more sophisticated and less power consuming, there is always a need for improvements.

Many conventional POR circuits consume power after the power supply has stabilized at an operating voltage. In battery powered systems, even a minor amount of DC power consumed by a POR circuit after system power-up can limit the battery operating time of the system. U.S. Pat. No. 5,323,067 discloses a POR circuit that is configured to switch the POR circuit off, after power-up. However, this known circuit requires many different stages which all have to be switched off separately. Furthermore, in order to achieve a reliable trip point of the POR circuit, dimensioning of the transistors used in the circuit is difficult.

SUMMARY

It is an object of the invention to provide an electronic device with a POR circuit that is easy to dimension, robust and less complex than prior art POR circuits.

In an aspect of the invention an electronic device is provided which comprises a POR circuit having a trigger stage. The trigger stage is configured to change an output if a first power supply voltage level exceeds a threshold voltage level. The threshold level can relate to a safe operating voltage level of the electronic device. There are further a first inverter and a second inverter which are cross-coupled. This means the output of one inverter is coupled with the input of the other inverter. An output of the second inverter can then be coupled to the trigger stage for switching the trigger stage off in response to a change of a signal at the output of the second inverter. The output of the second inverter may then be coupled to provide the POR output signal. The first inverter can be dimensioned to follow with a voltage level at an output an initially rising slope of the first power supply voltage level. The voltage level at the output of the first inverter may then rise if the first power supply voltage level rises and it may fall if the first power supply voltage level drops as long as the first power supply voltage level does not reach the threshold level. The second inverter may then be dimensioned to keep a voltage level at an output at a second power supply voltage level during the initially rising slope (before the first power supply voltage level has reached the threshold voltage level) of the first power supply voltage level. The second power supply voltage may, for example, be the ground level. Accordingly, the first inverter and the second inverter are dimensioned to have a prevalence to stick to the two different supply voltage levels (for example to the positive supply voltage level and ground). This aspect of the invention renders dimensioning of the POR circuit much easier, as the cross-coupled inverters are stabilized during power-up, when the first supply voltage rises.

In an embodiment, the first inverter may then comprise a first transistor coupled to the first power supply and a second transistor coupled to the second power supply. The first transistor may then be configured to conduct a greater current than the second transistor. The first transistor may be configured to sink or source more current (for example to or from the output node) than the second transistor when the first power supply voltage level rises during power-up of the electronic device. This can be achieved by the dimensions of the first and the second transistor. The first transistor may have a first aspect ratio and it can be coupled to the first power supply. The second transistor may have a second aspect ratio and it may be coupled to the second power supply. The first aspect ratio may then be greater than the second aspect ratio. The aspect ratio is the width to length ratio of a channel of a MOS transistor. The aspect ratios of the first and the second transistor may generally be configured in view of the current that either of the transistors can conduct. Therefore, the dimensioning is advantageously performed in consideration of the type of transistors (e.g., NMOS and PMOS) and their parameters relevant for their current drive capability. The expected input voltage at the control gates may also be considered in order to achieve the desired unbalance. In this regard, the second inverter may also comprise a first transistor coupled to the first power supply and a second transistor coupled to the second power supply, and the second transistor may be configured to conduct a greater current than the first transistor. The first transistor may have a first aspect ratio and it may be coupled to the first power supply. The second transistor may have a second aspect ratio and it may be coupled to the second power supply. The second aspect ratio may then be greater than the first aspect ratio. This means that the dimensioning of the second inverter is opposite to the first inverter with respect to their tendency to stick to a specific power supply level during a first phase of power-up until the first power supply voltage level has reached the threshold value. This is a particularly advantageous way of designing as the absolute values and the exact ratio of the transistors have less impact on the functionality than in conventional designs.

According to an aspect of the invention, the first inverter may further comprise a switch configured to be controlled with the output signal of the trigger stage. This provides that the cross-coupled first and second inverters can change their states in response to the output signal of the trigger stage.

The trigger stage may comprise a voltage divider and a third inverter coupled to receive the divided first power supply voltage level from the voltage divider in order to switch an output if the divided first power supply voltage level exceeds the threshold value. The voltage divider may be coupled between the first power supply voltage level and the second voltage level and it may be configured to be switched on and off in response to the POR output signal. The third inverter may be coupled to receive the divided first power supply voltage level from the voltage divider in order to switch its output if the divided first power supply voltage level exceeds the threshold value. The third inverter may be configured to follow the first power supply voltage level with a voltage level at the output. Advantageously, the third inverter may comprise a transistor coupled with a channel between the output and the second power supply and a resistor coupled between the first power supply and the output. This provides that the node between the transistor and the resistor (i.e., the output node of the third inverter) can be pulled up through the resistor until the transistor is switched. The trigger stage, and more specifically the voltage divider can then be dimensioned such that the divided voltage of the voltage divider reaches the threshold voltage level of the transistor of the third inverter, at the same time when the first power supply voltage level reaches the threshold voltage level required for setting the POR output signal (safe operating level of the first power supply).

The trigger stage may further comprise a fourth inverter coupled to the output of the third inverter. The output of the fourth inverter may then be coupled to provide the trigger stage output signal to the switch of the first inverter for switching the first inverter on and off.

The trigger stage may further comprise a transistor coupled with a channel between the output node of the trigger stage and the output node of the first inverter and with a control gate to the POR output node. This is useful to stabilize the state of the first inverter and the state of the second inverter during power-up of an electronic device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION

Figure 1:
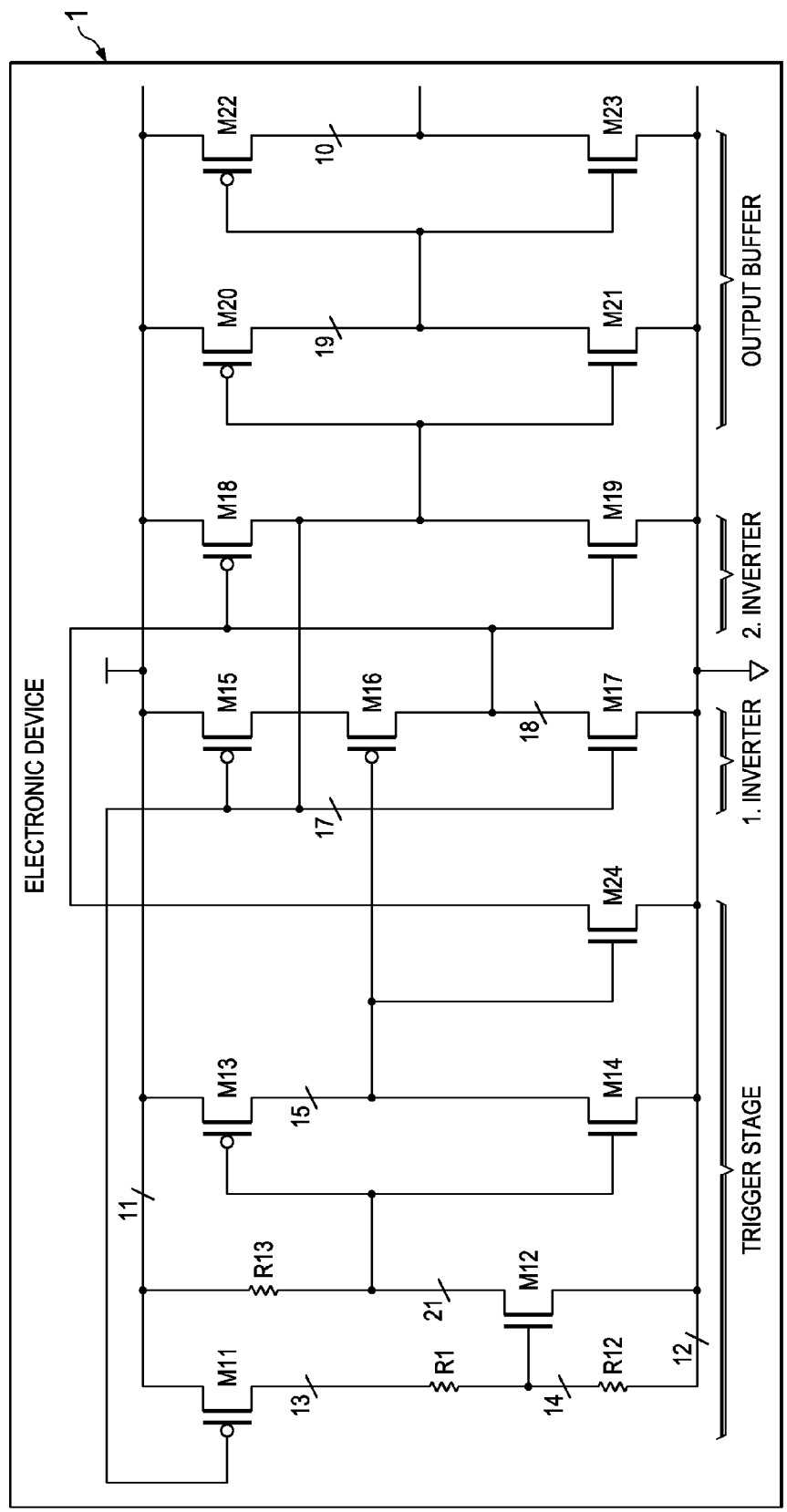
FIG. 1 is a simplified circuit diagram of an electronic device according to aspects of the invention.

Refer now to the Refer now to the drawings wherein depicted elements are, for the sake of clarity, not necessarily shown to scale and wherein like or similar elements are designated by the same reference numeral through the several views.

FIG. 1 shows a simplified circuit diagram of an electronic device 1 including a POR circuit according to aspects of the invention. There is a first power supply 11 and a second power supply 12. The first power supply 11 is the positive power supply of the device also referred to as VDD. The second power supply 12 is the ground level GND. During power-up, the first power supply 11 rises and reaches the final voltage level.

Node 17 provides the POR output signal that can be used as a reset signal for other stages (not shown), as for example a microcontroller or digital circuitry. There is an optional buffer stage that includes two inverters. One inverter includes transistors M20, M21, and the other transistors M22, and M23. The inverters are configured to buffer the POR reset signal received from node 17. The POR reset signal is active low.

The POR circuit has a first inverter including transistors M15, M16 and M17. There is a second inverter including transistors M18 and M19. Transistors M15, M16, and M18 are PMOS transistors. Transistor M17 and 19 are NMOS transistors. M15 is coupled to the first power supply 11 (VDD) and to transistor M16. Transistor M16 is coupled between M15 and the output node 18 of the first inverter. M17 is coupled between the output node 18 and the second power supply 12 (GND). The output node 18 of the first inverter is coupled to the input of the second inverter. This means that node 18 is coupled to the control gates of transistors M18 and M19, which are coupled in series between the first power supply 11 and the second power supply 12. The output node 17 of the second inverter (between transistor M18 and M19) is the POR output signal that serves to reset other stages, when the first power supply voltage level at node 11 is lower than a minimum required voltage level for safe operation of the electronic device 1. The output node 17 of the second inverter is also coupled to the input of the first inverter. This means that the output node 17 is coupled to the control gates of transistors M15 and M17. The first inverter M15/M17 and the second inverter M18/M19 are cross-coupled (i.e., the input of the first inverter is connected to the output of the second inverter and the input of the second inverter is connected to the output of the first inverter). Transistor M16 is configured as a switch, the control gate of which is coupled to node 15. Node 15 is the output of a trigger stage including transistors M11, M12, M13, M14, and M24 and resistors R1, R12 and R13. Transistors M12, M14 and M24 are NMOS transistors and transistors M11 and M13 are PMOS transistors.

The trigger stage includes a third inverter with resistor R13 and transistor M12. Resistor R13 is coupled to the first power supply 11 (VDD) and to transistor M12 and M12 is coupled to the second power supply 12 (GND). Resistor R13 provides that the voltage level at output node 21 basically follows the voltage level of the first power supply 11 as long as transistor M12 is turned off (not conducting). The trigger stage also includes a fourth inverter. The fourth inverter includes transistors M13 and M14. M13 is coupled to the first power supply 11 (VDD) and to transistor M14 at node 15. Transistor M14 is coupled to node 15 and to the second power supply 12. Node 15 is the output node of the trigger stage. The input of the fourth inverter M14, M15 is coupled to node 21 (i.e., to the output of the third inverter R13, M12). The trigger stage further comprises a voltage divider R1 and R12. The voltage divider includes resistors R1 and R12 and a transistor M11 which is configured as a switch. Transistor M11 is coupled with its channel between the first power supply 11 (VDD) and node 13. The control gate of transistor M11 is coupled to node 17. Resistor R1 is coupled between node 13 and node 14. Resistor R12 is coupled in series to R1 (i.e., to node 14 and with the other side to the second power supply 12). As long as transistor M11 is turned on (conducting), the voltage level at node 14 is basically a fraction of the voltage level at node 11 (i.e., the voltage level of the first power supply). The divided first power supply voltage level at node 14 is fed to the control gate of transistor M12. This provides that transistor M12 is turned on, when the voltage level at node 14 exceeds a threshold voltage level of transistor M12.

There is further an NMOS transistor M24 which is coupled with its control gate to the output node 15 of the trigger stage and with its channel between node 18 and the second power supply 12 (GND). Node 18 connects the input of the second inverter M18 and M19 and the output of the first inverter M15 and M17.

According to aspects of the invention, the transistors of the first inverter M15, M17 (also M16) and the transistors M18, M19 of the second transistor are dimensioned in a manner that simplifies the circuit and provides a robust design. NMOS transistor M15 is designed to have a greater capability of conducting current than transistor M17. Transistor M16 may then be designed similar to transistor M15. Transistor M16 may also have a greater capability of conducting current than transistor M17. Otherwise, transistor M16 would adversely affect the voltage level at node 18. Furthermore, transistor M19 is designed to have a greater capability of conducting current than transistor M18. This provides that node 18 sticks to the voltage level at node 11 (i.e., of the first power supply) when the first power supply initially begins to rise. Furthermore, the voltage level on node 17 sticks to the voltage level at the second power supply 12 (i.e., node 17 is kept at ground level when the first power supply initially rises). The specific dimensioning of the first inverter M15, M17, and M16 and the second inverter M18 and M19 provides a well defined state of the inverters during power-up. Furthermore, the ratio of the transistors M15 to M17 and M18 to M19 can be easily designed and the absolute values are less important. Transistors M15 and M16 may have a greater aspect ratio (width to length) than transistor M17. However, the different characteristics and parameters of PMOS and NMOS transistors in the specific technology have to be taken into consideration in order to achieve the desired unbalance of the inverters by their dimensions.

In an embodiment, the electronic device may be an integrated semiconductor device that is manufactured in a 180 nm technology (i.e., minimum gate length is 180 nm). The aspect ratio (channel width by length) of transistors M15 and M16 may then be 40 μm/0.18 μm. The aspect ratio of M19 may be 20 μm/0.18 μm. The aspect ratio of transistor M17 may be 1 μm/2 μm and the aspect ratio of M18 may be 2 μm/2 μm. In other words, the aspect ratio of the transistors with greater current drive capability can be n times greater than the aspect ratio of the transistors with lower current drive capability. The parameter n may then be greater than 1. It may also be greater than 10, 20 or 30. This provides a robust design.

Figure 2:
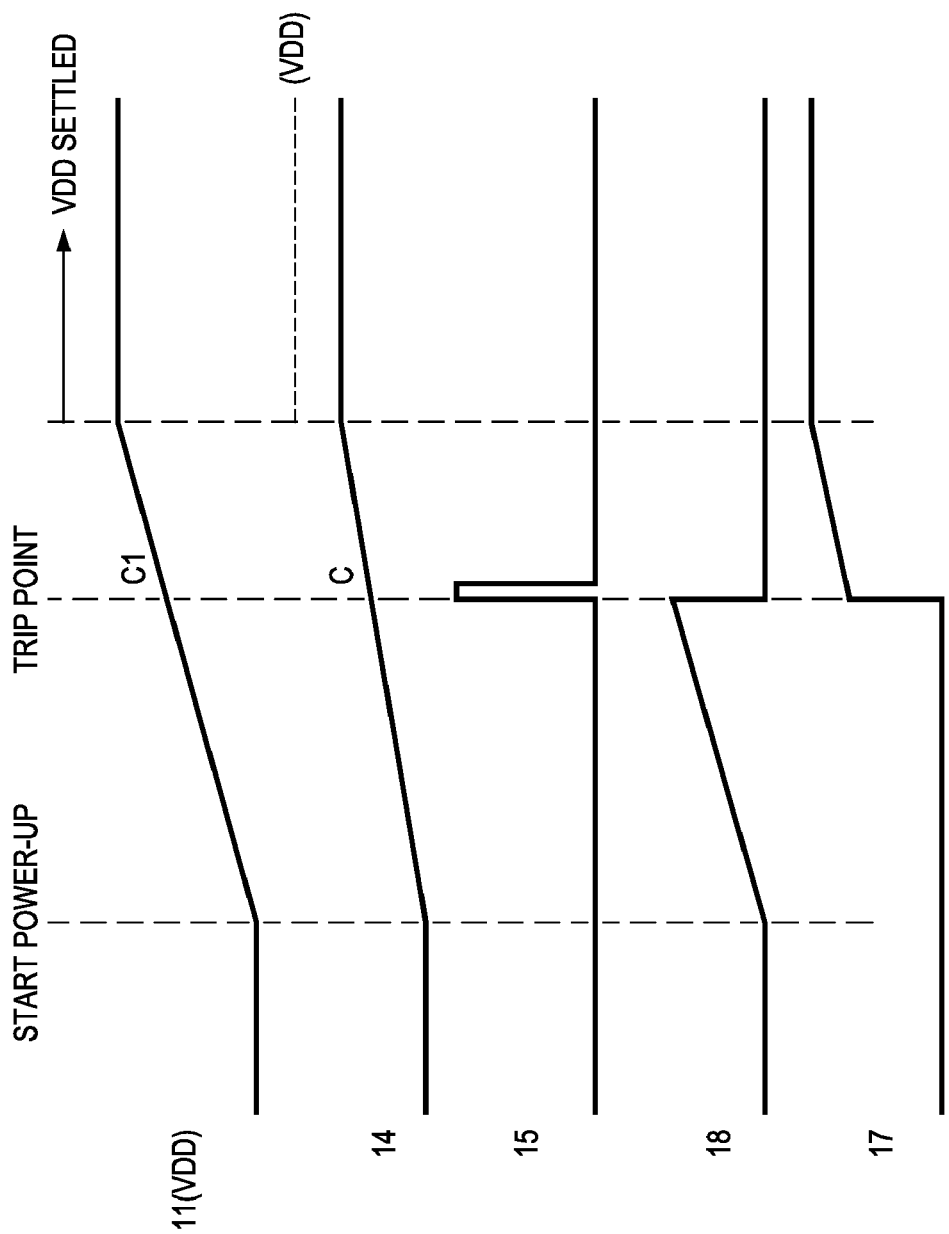
FIG. 2 is a diagram showing waveforms of signals of the circuit diagram shown in FIG. 1.

FIG. 2 shows waveforms of the voltage levels at nodes 11, 14, 15, 18 and the POR output node 17 of the circuit in FIG. 1 during power-up. The voltage level at node 11 (first power supply) rises in a linear (monotonous) ramp. This is only a simplified illustration of a power-up procedure. The voltage level at the output node N14 of the voltage divider R1/R12 follows the rising first power supply voltage level in a similar ramp having only a fraction of the voltage at node 11. The voltage divider R1/R12 is turned on through switch M11, as the voltage level on node 17 (POR output node) remains at ground (second power supply voltage level). Transistor M12 is turned off and remains off until the voltage level at node 14 reaches the threshold level of transistor M12. This threshold level is reached at the trip point C. The trip point C corresponds to trip point C1 of the first power supply 11 (VDD), where the first power supply reaches lower limit of a supply voltage level of VDD at which other stages of the electronic device 1 may be switched on. Also the voltage level at node 18 (output of the first inverter and input of the second inverter) starts to follow the rising slope of the first power supply due to the larger dimensions of transistors M15, M16. The large dimensions of transistor M19 with respect to transistor M18 provide that node 17 is kept at ground GND. Furthermore, the rising voltage level at node 18 supports that node 17 is kept at ground level GND. At trip points C1, C, transistor M12 is switched on, and the voltage level at the output node 21 of the third inverter R13/M12 is pulled to ground (second power supply). This provides that the fourth inverter M13/M14 is switched and that the voltage level at node 15 is pulled to the voltage level at node 11 (first power supply). The voltage level at node 18 is then pulled to ground through transistor M24 and the switch M16 is turned off. The voltage level at node 17 changes from ground to the positive supply first power supply voltage level at node 11 and the voltage level at node 18 is pulled to ground (second supply voltage level). The rising slope of the voltage level at node 17 is a consequence of the rising first power supply voltage level. The POR output signal at node 17 is valid when the trip point C, C1 is passed. The POR output signal at node 17 is off when trip point C, C1 is passed. However, the high voltage level at node 17 provides that transistor M11 is turned off. Therefore, the resistive divider R1/R12 is turned off and the voltage level at node 14 drops to ground. Transistor M12 is turned off and the voltage level at the output node 21 of the third inverter is pulled-up to VDD. This causes the fourth inverter M13/M14 to be switched and the voltage at node 15 is pulled to ground. The length of the positive pulse on node 15 is defined by the propagation delay of the signals through the circuit, starting at node 15 and ending at node 15. A change of the signal at node 15 can only occur if a change at node 17 (POR output) is accomplished. However, the whole circuit is then inherently switched off, after the pulse at node 15 occurred. This means that power consumption is reduced to zero.

Having thus explained the Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
a voltage rail;
a trigger stage having:
 a PMOS transistor that is coupled to the voltage rail at its source;
 a voltage divider that is coupled drain of the PMOS transistor;
 a first NMOS transistor that is coupled to the voltage divider at its gate;
 a first resistor that is coupled between the voltage rail and the first NMOS transistor at its drain;
 a first inverter that is coupled to the drain of the first NMOS transistor; and
 a second NMOS transistor that is coupled to the first inverter at its gate;
a second inverter that is coupled to the gate of the PMOS transistor and the drain of the second NMOS transistor, wherein the second inverter includes a switch that is coupled to the first inverter;
a third inverter that is coupled to the gate of the PMOS transistor and the drain of the second NMOS transistor; and
an output buffer that is coupled to the third inverter.
2. The apparatus of claim 1, wherein the PMOS transistor is a first PMOS transistor, and wherein the switch further comprises a second PMOS transistor.

3. The apparatus of claim 2, wherein the second inverter further comprises:
- a third PMOS transistor that is coupled to the source of the second PMOS transistor at its drain, the gate of the first PMOS transistor at its gate, and the voltage rail at its source; and
- a third NMOS transistor that is coupled to the drain of the second NMOS transistor and the drain of the second PMOS transistor at its drain and the gate of the first PMOS transistor at its gate.

4. The apparatus of claim 3, wherein the output buffer further comprises a plurality of output inverters coupled in series with one another.

5. The apparatus of claim 4, wherein the third inverter further comprises:
- a fourth PMOS transistor that is coupled to the drain of the second NMOS transistor at its gate, the gate of the first PMOS transistor at its drain, and the voltage rail at its source; and
- a fourth NMOS transistor that is coupled to the gate of the first PMOS transistor at its drain and the drain of the second NMOS transistor at its gate.

6. An apparatus comprising:
- a voltage rail;
- a trigger stage having:
  - a first PMOS transistor that is coupled to the voltage rail at its source;
  - a voltage divider that is coupled drain of the first PMOS transistor;
  - a first NMOS transistor that is coupled to the voltage divider at its gate;
  - a first resistor that is coupled between the voltage rail and the first NMOS transistor at its drain;
  - a first inverter that is coupled to the drain of the first NMOS transistor; and
  - a second NMOS transistor that is coupled to the first inverter at its gate;
- a second inverter having:
  - a second PMOS transistor that is coupled to the first inverter at its gate;
  - a third PMOS transistor that is coupled to the source of the second PMOS transistor at its drain, the gate of the first PMOS transistor at its gate, and the voltage rail at its source; and
  - a third NMOS transistor that is coupled to the drain of the second NMOS transistor and the drain of the second PMOS transistor at its drain and the gate of the first PMOS transistor at its gate, wherein the aspect ratios of each of the second and third PMOS transistors is greater than the aspect ratio of the third NMOS transistor;
- a third inverter that is coupled to the gate of the PMOS transistor and the drain of the second NMOS transistor; and
- an output buffer that is coupled to the third inverter.

7. The apparatus of claim 6, wherein the output buffer further comprises a plurality of output inverters coupled in series with one another.

8. The apparatus of claim 7, wherein the third inverter further comprises:
- a fourth PMOS transistor that is coupled to the drain of the second NMOS transistor at its gate, the gate of the first PMOS transistor at its drain, and the voltage rail at its source; and
- a fourth NMOS transistor that is coupled to the gate of the first PMOS transistor at its drain and the drain of the second NMOS transistor at its gate.

* * * * *